US011640953B2

United States Patent
Harada

(10) Patent No.: US 11,640,953 B2
(45) Date of Patent: May 2, 2023

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Masatake Harada, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 53 days.

(21) Appl. No.: 17/341,518

(22) Filed: Jun. 8, 2021

(65) Prior Publication Data

US 2022/0084983 A1 Mar. 17, 2022

(30) Foreign Application Priority Data

Sep. 17, 2020 (JP) .............................. JP2020-156028

(51) Int. Cl.
*H01L 23/00* (2006.01)
*H01L 23/488* (2006.01)
*H01L 21/50* (2006.01)

(52) U.S. Cl.
CPC .............. *H01L 24/91* (2013.01); *H01L 21/50* (2013.01); *H01L 23/488* (2013.01)

(58) Field of Classification Search
CPC ....................................................... H01L 24/91
USPC ........................................................... 257/783
See application file for complete search history.

(56) References Cited

U.S. PATENT DOCUMENTS

| 2011/0049557 A1* | 3/2011 | Meng ................ H01L 27/14618 |
| | | 257/E33.056 |
| 2011/0127633 A1* | 6/2011 | Nadeau ................. H01L 23/544 |
| | | 428/156 |

FOREIGN PATENT DOCUMENTS

JP 2013-026506 A 2/2013

* cited by examiner

*Primary Examiner* — Ajay Arora
(74) *Attorney, Agent, or Firm* — Studebaker & Brackett PC

(57) ABSTRACT

An object is to provide a technique capable of regulating a direction in which an adhesive agent used for bonding a base plate and a case is wetly widened. A semiconductor device includes a base plate and a case. The case is bonded to a peripheral edge part of the base plate via an adhesive agent. A dip which is an application position where the adhesive agent is applied and an inclined surface directed downward from the dip toward an outer peripheral side or an inclined surface directed downward from the dip toward an inner peripheral side are formed in the peripheral edge part of the base plate.

8 Claims, 3 Drawing Sheets

F I G. 5
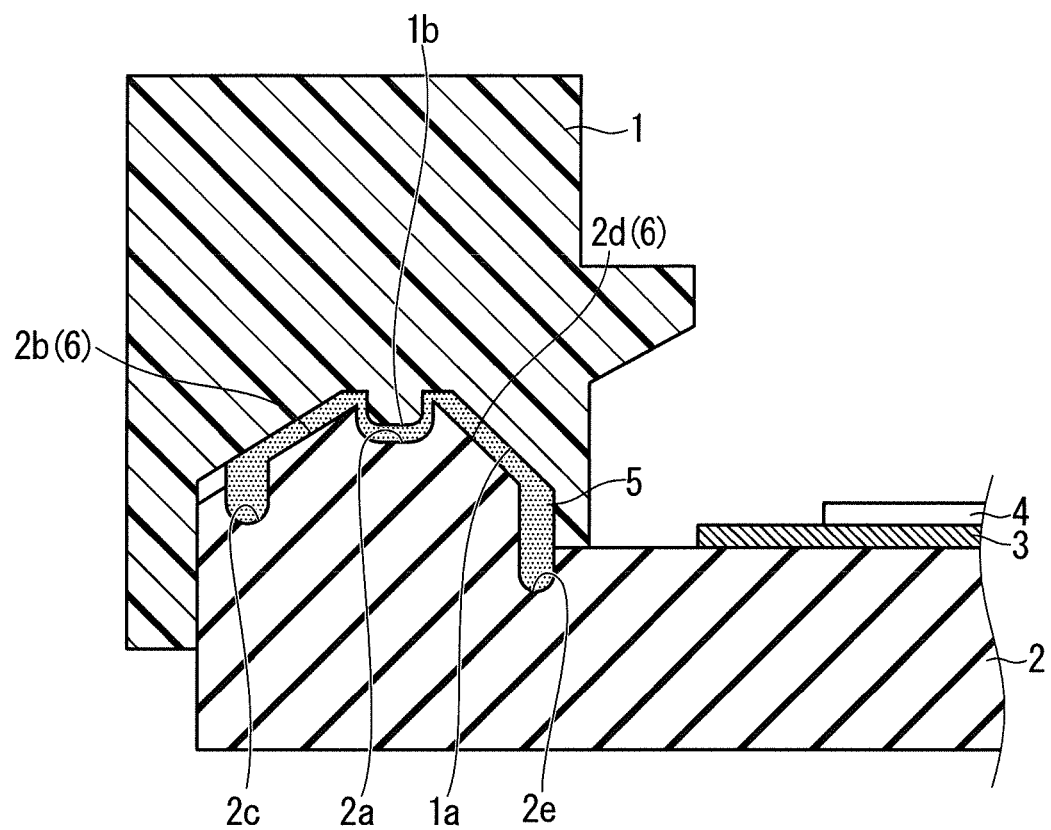

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing a semiconductor device.

Description of the Background Art

An adhesive agent is used for bonding a base plate and a case in a process of manufacturing a semiconductor device. There is a semiconductor device having a structure that an applied adhesive agent does not flow down in bonding the base plate and the case.

For example, Japanese Patent Application Laid-Open No. 2013-26506 discloses a structure that a bonding surface of a cover body and an insulating base body forms an inclined surface, and a dip housing an excess adhesive agent is provided in an inner side surface of a concave portion of the insulating base body so that the adhesive agent which is excessively applied does not flow down. Japanese Patent Application Laid-Open No. 2013-26506 describes solder, a brazing material, glass, and an organic resin adhesive agent as an adhesive agent, for example.

SUMMARY

However, in the technique described in Japanese Patent Application Laid-Open No. 2013-26506, a position of applying the adhesive agent is not defined, thus the adhesive agent is applied to the whole bonding surface of the cover body and the insulating base body. Thus, if a temperature of the adhesive agent is increased in hardening a sealing resin and viscosity of the adhesive agent decreases, the adhesive agent is wetly widened to an upper side and a lower side along the inclined surface. As a result, there is a problem that a direction in which the adhesive agent is wetly widened cannot be regulated.

An object of the present disclosure is to provide a technique capable of regulating a direction in which an adhesive agent used for bonding a base plate and a case is wetly widened.

A semiconductor device according to the present disclosure includes a base plate and a case. The case is boned to a peripheral edge part of the base plate. A dip which is an application position where an adhesive agent is applied and an inclined surface directed downward from the dip toward an outer peripheral side or an inner peripheral side are formed in the peripheral edge part of the base plate.

If a temperature of the adhesive agent is increased in hardening a sealing resin and viscosity of the adhesive agent decreases, the adhesive agent is wetly widened along the inclined surface from the dip, thus a direction in which the adhesive agent is wetly widened can be regulated.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a cross-sectional view of a semiconductor device according to a modification example of the embodiment 2.

DESCRIPTION OF THE PREFERRED EMBODIMENTS

Embodiment 1

Figure 1:
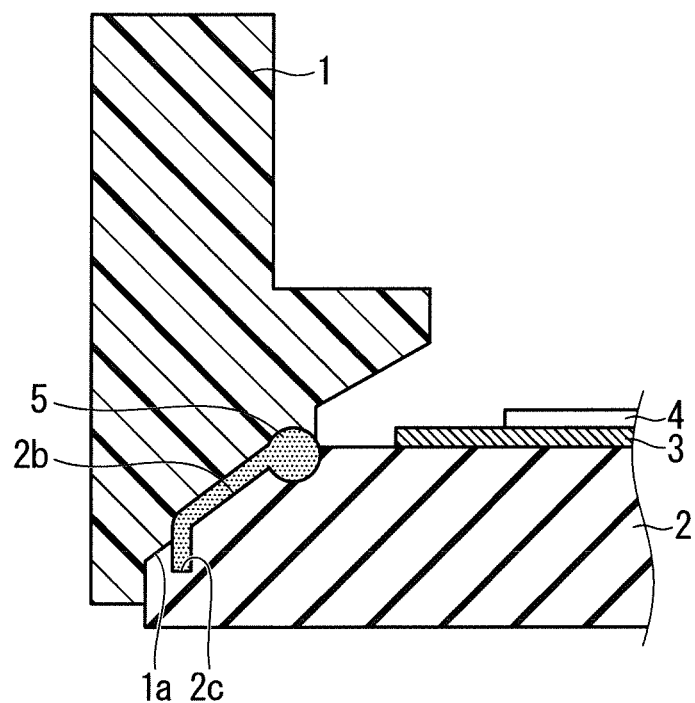
FIG. 1 is a cross-sectional view of a semiconductor device according to an embodiment 1.
Figure 2:
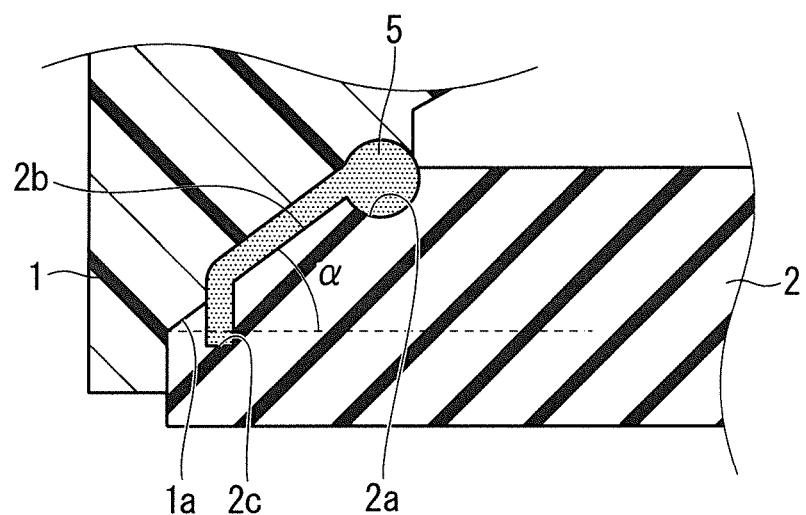
FIG. 2 is an enlarged cross-sectional view of a bonding location of a base plate and a case included in the semiconductor device according to the embodiment 1.

An embodiment 1 is described hereinafter using the drawings. FIG. 1 is a cross-sectional view of a semiconductor device according to the embodiment 1. FIG. 2 is an enlarged cross-sectional view of a bonding location of a base plate 2 and a case 1 included in the semiconductor device according to the embodiment 1.

As illustrated in FIG. 1, the semiconductor device includes the base plate 2, the case 1, a metal pattern 3, and a semiconductor element 4. The base plate 2 has a rectangular shape in a plan view, and is made up of resin having insulation properties.

The metal pattern 3 is formed in a center part of the base plate 2. That is to say, the metal pattern 3 is not formed in a peripheral edge part of the base plate 2. The metal pattern 3 is made of aluminum, silver, or copper, for example.

The semiconductor element 4 is fixed to an upper surface of the metal pattern 3 by soldering. One semiconductor element 4 is illustrated in FIG. 1, however, the number thereof is not limited to one, thus two or more semiconductor elements 4 may also be applicable.

The semiconductor element 4 is an insulated gate bipolar transistor (IGBT) chip or a free wheel diode chip, for example.

The case 1 has a rectangular frame-like shape in a plan view, and is made of resin, for example. A concave portion 1a is formed in a whole periphery of a lower end portion of the case 1. The concave portion 1a is formed into a shape capable of being fitted to the peripheral edge part of the base plate 2. A sealing resin not shown in the drawings fills an inner portion of the case 1.

Next, a bonding of the base plate 2 and the case 1 is described using FIG. 1 and FIG. 2. As illustrated in FIG. 1 and FIG. 2, the case 1 is boned to the peripheral edge part of the base plate 2 via an adhesive agent 5. A dip 2a, an inclined surface 2b, and a groove 2c are formed in the peripheral edge part of the base plate 2.

The dip 2a has a shape concaved to a lower side. The dip 2a is formed on an upper surface of the base plate 2, specifically, on a whole inner peripheral side of the peripheral edge part of the base plate 2. The dip 2a is an application position where the adhesive agent 5 is applied. The inclined surface 2b is formed downward in a whole periphery from the dip 2a toward an outer peripheral side. The adhesive agent 5 spilling out of the dip 2a is wetly widened to a lower side along the inclined surface 2b. The groove 2c has a shape concaved to a lower side, and is formed in a whole periphery of a lower end portion of the inclined surface 2b. The adhesive agent 5 wetly widened to the lower side along the inclined surface 2b is housed in the groove 2c.

Herein, an inclined angle α of the inclined surface 2b is preferably equal to or larger than 45° and equal to or smaller than 60° so the adhesive agent 5 is wetly widened along the inclined surface 2b easily. The adhesive agent 5 is a thermoset epoxy resin adhesive agent, for example. When a temperature of the adhesive agent 5 is 25° C., viscosity of the adhesive agent 5 is preferably equal to or larger than 25 Pa·s, and when a temperature of the adhesive agent 5 is equal to or larger than 50° C., viscosity of the adhesive agent 5 is preferably equal to or smaller than 10 Pa·s.

In a process of manufacturing a semiconductor device, after the semiconductor element 4 is fixed to the upper surface of the metal pattern 3, the adhesive agent 5 whose temperature is set to 25° C. is applied to the dip 2a of the base plate 2, and the case 1 is bonded to the peripheral edge part of the base plate 2 via the adhesive agent 5. At this time, the adhesive agent 5 applied to the dip 2a is hardly wetly widened. Next, when the temperature of the adhesive agent 5 is increased to 50° C. or higher at a time of hardening a sealing resin after the case 1 is filled with a sealing resin, the viscosity of the adhesive agent 5 decreases and is wetly widened easily. Accordingly, the adhesive agent 5 can be wetly widened to the lower side along the inclined surface 2b from the dip 2a.

At this time, the dip 2a and the inclined surface 2b of the base plate 2 are preferably formed by press processing or cutting processing.

Figure 3:
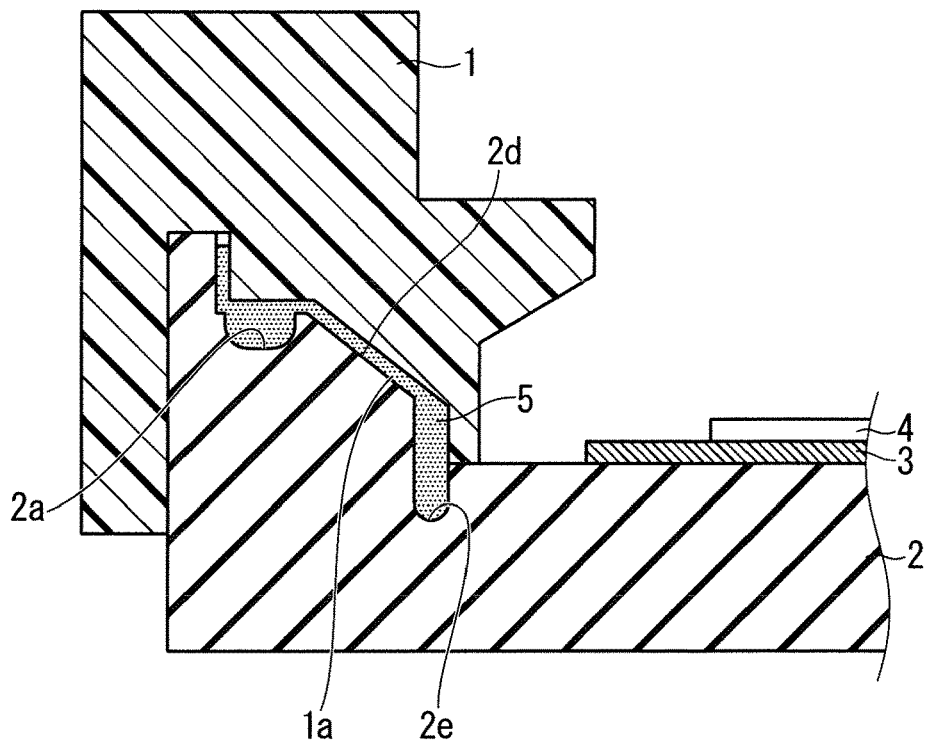
FIG. 3 is a cross-sectional view of a semiconductor device according to a modification example of the embodiment 1.

Next, a modification example of the embodiment 1 is described using FIG. 3. FIG. 3 is a cross-sectional view of a semiconductor device according to the modification example of the embodiment 1.

As illustrated in FIG. 3, the peripheral edge part of the base plate 2 protrudes to an upper side more than the center part of the base plate 2. The dip 2a, an inclined surface 2d, and a groove 2e are formed in the peripheral edge part of the base plate 2. The dip 2a is formed on a whole outer peripheral side of the peripheral edge part of the base plate 2. The end portion of the base plate 2 which is an outer peripheral side of the dip 2a protrudes to the upper side more than the dip 2a, thus the adhesive agent 5 applied to the dip 2a does not go beyond the end portion of the base plate 2 from the dip 2a and is not wetly widened to the outer peripheral side.

The inclined surface 2d is formed downward in a whole periphery from the dip 2a toward the inner peripheral side. The adhesive agent 5 spilling out of the dip 2a is wetly widened to the lower side along the inclined surface 2d. The groove 2e has a shape concaved to the lower side, and is formed in a whole periphery of a lower end portion of the inclined surface 2d. The adhesive agent 5 wetly widened to the lower side along the inclined surface 2d is housed in the groove 2e. An inclined angle α of the inclined surface 2d is preferably equal to or larger than 45° and equal to or smaller than 60° so the adhesive agent 5 is wetly widened along the inclined surface 2d easily.

As described above, the semiconductor device according to the embodiment 1 and the modification example of the embodiment 1 includes the base plate 2 and the case 1 bonded to the peripheral edge part of the base plate 2 via the adhesive agent 5, and the dip 2a which is the application position where the adhesive agent 5 is applied and the inclined surfaces 2b and 2d directed downward from the dip 2a toward the outer peripheral side or the inner peripheral side are formed in the peripheral edge part of the base plate 2.

Accordingly, if the temperature of the adhesive agent 5 is increased in hardening a sealing resin and viscosity of the adhesive agent 5 decreases, the adhesive agent 5 is wetly widened along the inclined surfaces 2b and 2d from the dip 2a, thus a direction in which the adhesive agent 5 is wetly widened can be regulated. The dip 2a is formed, thus the application position of the adhesive agent 5 can be regulated.

The dip 2a is provided on the upper surface of the base plate 2, and the inclined surface 2b is formed downward from the dip 2a toward the outer peripheral side. Accordingly, if the temperature of the adhesive agent 5 is increased in hardening the sealing resin and the viscosity of the adhesive agent 5 decreases, the direction in which the adhesive agent 5 is wetly widened can be regulated from the dip 2a to the outer peripheral side.

The peripheral edge part of the base plate 2 protrudes to the upper side more than the central part of the base plate 2, and the inclined surface 2d is formed downward from the dip 2a toward the inner peripheral side. Accordingly, if the temperature of the adhesive agent 5 is increased in hardening the sealing resin and the viscosity of the adhesive agent 5 decreases, the direction in which the adhesive agent 5 is wetly widened can be regulated from the dip 2a to the inner peripheral side. Accordingly, a spilling of the adhesive agent 5 outside a manufactured product can be suppressed.

The inclined angle α of each of the inclined surfaces 2d and 2d is equal to or larger than 45° and equal to or smaller than 60°, thus when the temperature of the adhesive agent 5 is increased and the viscosity of the adhesive agent 5 decreases, the adhesive agent 5 is wetly widened along the inclined surfaces 2b and 2d from the dip 2a easily.

When the temperature of the adhesive agent 5 is 25° C., the viscosity of the adhesive agent 5 is equal to or larger than 25 Pa·s, and when the temperature of the adhesive agent 5 is equal to or larger than 50° C., the viscosity of the adhesive agent 5 is equal to or smaller than 10 Pa·s. A method of manufacturing the semiconductor device includes: a step (a) of applying the adhesive agent 5 whose temperature is set to 25° C. to the dip 2a of the base plate 2, and bonding the case 1 to the peripheral edge part of the base plate 2 via the adhesive agent 5; and a step (b) of wetly widening the adhesive agent 5, whose temperature is increased to 50° C. or higher at a time of hardening a sealing resin filling the case 1, to the lower side along the inclined surfaces 2b and 2d from the dip 2a.

Accordingly, when the adhesive agent 5 is applied, the adhesive agent 5 is hardly wetly widened, thus an adhesion and spilling of the adhesive agent 5 to an unexpected location can be suppressed. In the meanwhile, the adhesive agent 5 is wetly widened along the inclined surfaces 2b and 2d easily after the base plate 2 and the case 1 are bonded.

The dip 2a and the inclined surfaces 2b and 2d are formed by press processing or cutting processing, thus a processing cost of the base plate 2 can be reduced by adopting a general method of processing the base plate 2.

Embodiment 2

Figure 4:
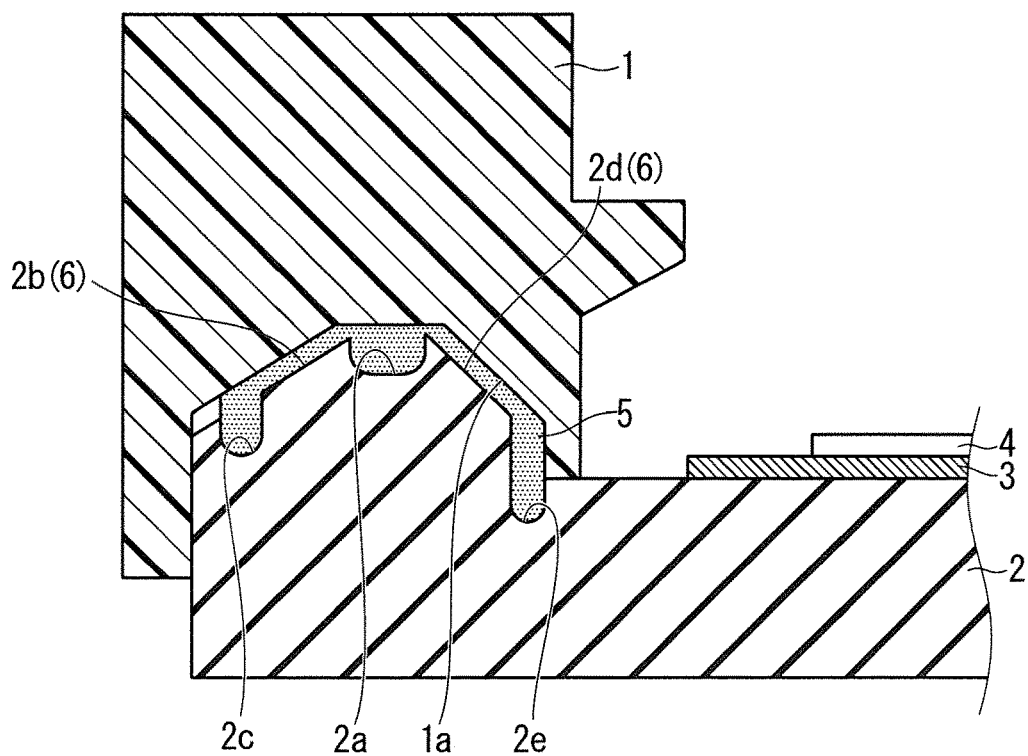
FIG. 4 is a cross-sectional view of a semiconductor device according to an embodiment 2.

Next, a semiconductor device according to an embodiment 2 is described. FIG. 4 is a cross-sectional view of a semiconductor device according to the embodiment 2. In the embodiment 2, the same reference numerals are assigned to the same constituent elements described in the embodiment 1, and the description thereof will be omitted.

As illustrated in FIG. 4, in the embodiment 2, the peripheral edge part of the base plate 2 protrudes to the upper side more than the center part of the base plate 2. The dip 2a, an inclined surface 6, and the grooves 2c and 2e are formed in the peripheral edge part of the base plate 2.

The inclined surface 6 includes the inclined surface 2b as a first inclined surface formed to be directed downward from the dip 2a toward the outer peripheral side and the inclined surface 2d as a second inclined surface formed to be directed downward from the dip 2a toward the inner peripheral side.

The dip 2a is formed in the whole periphery of a center of the peripheral edge part of the base plate 2. The inclined surface 2b is formed downward in the whole periphery from the dip 2a toward the outer peripheral side. The groove 2c is formed in the whole periphery of the lower end portion of the inclined surface 2b. The adhesive agent 5 wetly widened to the lower side along the inclined surface 2b is housed in the groove 2c. The inclined surface 2d is formed downward in a whole periphery from the dip 2a toward the inner peripheral side. The groove 2e is formed in the whole periphery of the lower end portion of the inclined surface 2d. The adhesive agent 5 wetly widened to the lower side along the inclined surface 2d is housed in the groove 2e. An inclined angle α of each of the inclined surfaces 2b and 2d is preferably equal to or larger than 45° and equal to or smaller than 60°.

Next, a modification example of the embodiment 2 is described using FIG. 5. FIG. 5 is a cross-sectional view of a semiconductor device according to the modification example of the embodiment 2.

As illustrated in FIG. 5, a protrusion 1b housed in the dip 2a is provided in a portion of the case 1 facing the dip 2a. The protrusion 1b is provided in the whole periphery of the case 1. When the base plate 2 and the case 1 are bonded, the protrusion 1b crushes the adhesive agent 5 applied to the dip 2a, thereby being able to promote the wetting and widening of the adhesive agent 5.

As described above, in the semiconductor device according to the embodiment 2 and the modification example of the embodiment 2, the peripheral edge part of the base plate 2 protrudes to the upper side more than the center part of the base plate 2. The inclined surface 6 includes the inclined surface 2b as the first inclined surface formed to be directed downward from the dip 2a toward the outer peripheral side and the inclined surface 2d as the second inclined surface formed to be directed downward from the dip 2a toward the inner peripheral side.

Accordingly, the adhesive agent 5 can be wetly widened not in one direction but in two directions, thus a time for wetting and widening can be reduced.

The protrusion 1b housed in the dip 2a is provided in the portion of the case 1 facing the dip 2a. Accordingly, when the base plate 2 and the case 1 are bonded, the protrusion 1b crushes the adhesive agent 5 applied to the dip 2a, thereby being able to further reduce the time for wetting and widening.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
 a base plate; and
 a case bonded to a peripheral edge part of the base plate via an adhesive agent, wherein
 a dip which is an application position where the adhesive agent is applied and an inclined surface directed downward from the dip toward an outer peripheral side or an inner peripheral side are formed in the peripheral edge part of the base plate.

2. The semiconductor device according to claim 1, wherein
 the dip is provided on an upper surface of the base plate, and
 the inclined surface is formed downward from the dip toward an outer peripheral side.

3. The semiconductor device according to claim 1, wherein
 the peripheral edge part of the base plate protrudes to an upper side more than a center part of the base plate, and
 the inclined surface is formed downward from the dip toward an inner peripheral side.

4. The semiconductor device according to claim 1, wherein
 the peripheral edge part of the base plate protrudes to an upper side more than a center part of the base plate, and
 the inclined surface includes a first inclined surface formed to be directed downward from the dip toward an outer peripheral side and a second inclined surface formed to be directed downward from the dip toward an inner peripheral side.

5. The semiconductor device according to claim 4, wherein
 a protrusion housed in the dip is provided in a portion of the case facing the dip.

6. The semiconductor device according to claim 1, wherein
 an inclined angle of the inclined surface is equal to or larger than 45° and equal to or smaller than 60°.

7. A method of manufacturing a semiconductor device for manufacturing the semiconductor device according to claim 1, wherein
 when a temperature of the adhesive agent is 25° C., viscosity of the adhesive agent is equal to or larger than 25 Pa·s, and when a temperature of the adhesive agent is equal to or larger than 50° C., viscosity of the adhesive agent is equal to or smaller than 10 Pa·s, the method comprising:
 (a) applying the adhesive agent whose temperature is set to 25° C. to the dip of the base plate, and bonding the case to the peripheral edge part of the base plate via the adhesive agent; and
 (b) wetly widening the adhesive agent, whose temperature is increased to 50° C. or higher at a time of hardening a sealing resin filling the case, to the lower side along the inclined surface from the dip.

8. The method of manufacturing the semiconductor device according to claim 7, wherein
 the dip and the inclined surface are formed by press processing or cutting processing.

* * * * *